United States Patent [19]
Jung et al.

[11] Patent Number: 6,064,609
[45] Date of Patent: May 16, 2000

[54] SEMICONDUCTOR MEMORY DEVICE WITH TRUE/COMPLEMENT REDUNDANCY SCHEME

[75] Inventors: Chul-Min Jung, Seoul; Min-Chul Chung, Kyunggi-do, both of Rep. of Korea

[73] Assignee: Samsung Electronics, Co., Ltd., Suwon, Rep. of Korea

[21] Appl. No.: 09/373,447

[22] Filed: Aug. 12, 1999

[30] Foreign Application Priority Data

Aug. 12, 1998 [KR] Rep. of Korea ................ 98-32774

[51] Int. Cl.$^7$ ................ G11C 7/00; G11C 8/00
[52] U.S. Cl. ................ 365/200; 365/225.7; 365/230.03; 365/230.06
[58] Field of Search ................ 365/200, 225.7, 365/230.03, 230.06

[56] References Cited

U.S. PATENT DOCUMENTS

| 4,817,056 | 3/1989 | Furutani et al. | 365/200 |
|---|---|---|---|
| 4,849,938 | 7/1989 | Furutani et al. | 365/200 |
| 5,563,832 | 10/1996 | Kagami | 365/200 |

*Primary Examiner*—Trong Phan
*Attorney, Agent, or Firm*—Marger Johnson & McCollom, P.C.

[57] ABSTRACT

Disclosed is a semiconductor memory device including a redundancy controller. The redundancy controller is structured using pass gate logic, dynamic inverter circuits, and a true/complement decoder scheme. The redundancy controller includes first and second redundancy enable circuits corresponding respectively to first and second redundant columns. A first and second fuse boxes are coupled respectively to the first and second redundancy enable circuits. The first and second fuse boxes each include a fuse box circuit corresponding to the column address signals and a fuse element. Each fuse box circuit receives a corresponding pair of true and complement column address signals and manipulates the true and complement column address signals responsive to the fuse element. A first decoding means decodes the manipulated versions of the true and complement column address signals and generates first and second true decoded pulse signals and first and second complement decoded pulse signals. A second decoding means decodes the manipulated versions of the true and complement column address signals and generates third and fourth true decoded pulse signals and third and fourth complement decoded pulse signals. A sense amplification control signal generating means produces the sense amplification control signal responsive to the first, second, third, and fourth true decoded pulse signals and the first, second, third, and fourth complement decoded pulse signals. A row select signal generating means produces the row select signal responsive to first, second, third, and fourth true decoded pulse signals. The above-described redundancy controller improves the redundancy speed.

12 Claims, 12 Drawing Sheets

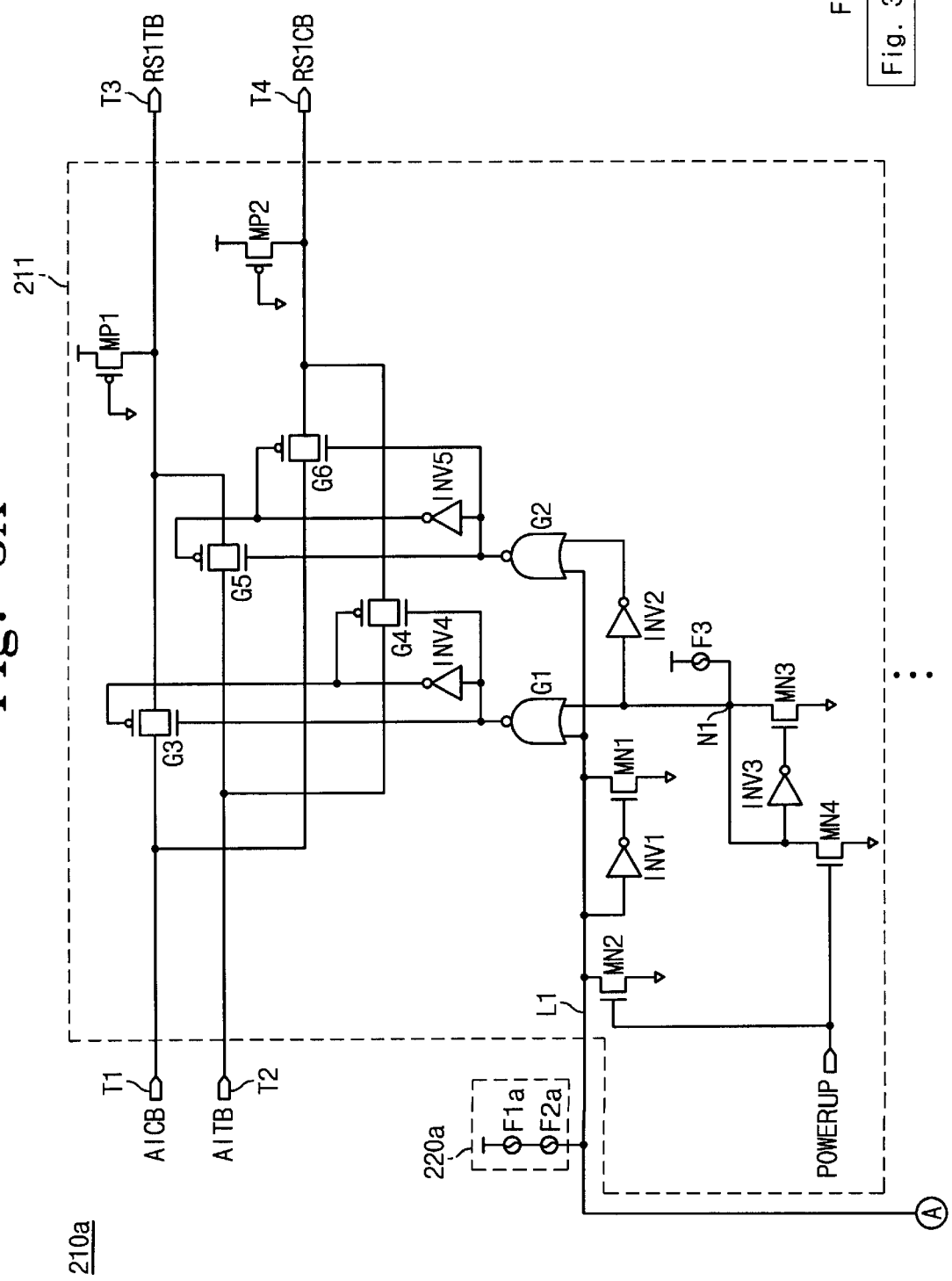

SEMICONDUCTOR MEMORY DEVICE WITH TRUE/COMPLEMENT REDUNDANCY SCHEME

FIELD OF THE INVENTION

The present invention relates to a semiconductor memory device and, more particularly, to a semiconductor memory device having a new redundancy scheme.

BACKGROUND OF THE INVENTION

As is well known in the art, wafer yield is a key factor in fabrication costs associated with the production of memory chips. The wafer yield is defined as the ratio of non-defective chips to total chips fabricate on a given wafer. Generally, as the integration density of a memory chip increases, the possibility of defects occurring in one or more memory cells of the memory chip also increases. Thus, the higher the integration density of a plurality of memory chips fabricated on a given wafer, the lower the wafer yield. The most effective approach for removing defects and thus improving the wafer yield, is to provide a redundancy circuit. A redundancy circuit provides memory cells of one or more redundant rows and/or columns, respectively, for replacing rows and/or columns of defective memory cells in a wafer level (or during a test mode). One example of the redundancy circuit is disclosed in U.S. Pat. No. 5,768,197, entitled "REDUNDANCY CIRCUIT FOR SEMICONDUCTOR MEMORY DEVICE", herein incorporated by reference ('197 patent).

As disclosed in the '197 patent, the replacement of a row of memory cells arranged along a word line comprising a defective cell is performed by programming an address of defective row or column in a decoder used to select a redundant word line or a redundant bit line. A well-known method for selecting the redundant word or bit line is by blowing a fuse using a laser or overcurrent. These methods, however, slow down the redundancy operation negatively affecting the fabrication cycle time. Accordingly, a need remains for a new redundancy scheme for replacing a column(s) of defective cell(s).

SUMMARY OF THE INVENTION

It is therefore an object of the present invention to provide a semiconductor memory device having new redundancy scheme capable of speeding up the redundancy operation.

In order to attain the above objects, according to an aspect of the present invention, there is provided a semiconductor memory device that includes an array having a plurality of memory blocks, a plurality of main word lines, and a redundant block having redundant bit lines corresponding to redundant memory cells, each of the memory blocks having a plurality of memory cells arranged at intersections of sub word lines and bit lines and the redundant block sharing the sub word lines of a predetermined memory block; a plurality of block sense amplifiers each arranged to correspond to the plurality of memory blocks, the redundant block sharing a block sense amplifier corresponding to the predetermined memory block; a redundancy controller for receiving column address signals indicative of a bit line in a selected column of a memory block and generating a sense amplification control signal, a row select signal, and column select signals when the selected column is defective; a plurality of sub word line decoders corresponding to the plurality of memory blocks, a sub word line of the redundant block being selected by a sub word line decoder corresponding to the redundant block responsive to the row select signal; and a redundant decoder for selecting a redundant column in the redundant block responsive to the column select signals, the block sense amplifier shared between the redundant block and the predetermined memory block being activated responsive to the sense amplification control signal to thereby sense data from the redundant block.

Each of the column address signals comprises a pair of true and complement column address signals.

Moreover, the redundant block comprises a first redundant column and a second redundant column. The redundancy controller comprises first and second redundancy enable circuits corresponding respectively to the first and second redundant columns, the first and second redundancy enable circuits indicating whether a corresponding redundancy column is replaced; first and second fuse boxes coupled respectively to the first and second redundancy enable circuits, the first and second fuse boxes each including a fuse box circuit corresponding to the column address signals and a fuse element, each fuse box circuit receiving a corresponding pair of true and complement column address signals and manipulating the true and complement column address signals responsive to the fuse element; first decoding means for decoding the manipulated versions of the true and complement column address signals and generating first and second true decoded pulse signals and first and second complement decoded pulse signals; second decoding means for decoding the manipulated versions of the true and complement column address signals and generating third and fourth true decoded pulse signals and third and fourth complement decoded pulse signals; sense amplification control signal generating means for producing the sense amplification control signal responsive to the first, second, third, and fourth true decoded pulse signals and the first, second, third, and fourth complement decoded pulse signals; and row select signal generating means for producing the row select signal responsive to first, second, third, and fourth true decoded pulse signals.

BRIEF DESCRIPTION OF THE DRAWINGS

The foregoing and other objects, features, and advantages of the invention will become more readily apparent from the following detailed description of a preferred embodiment that proceeds with reference to the following drawings. Like references denote similar elements.

FIGS. 3A–B are detailed circuit diagrams of the fuse box shown in FIG. 1 according to a preferred embodiment of the present invention;

DESCRIPTION OF THE PREFERRED EMBODIMENT

Figure 1:
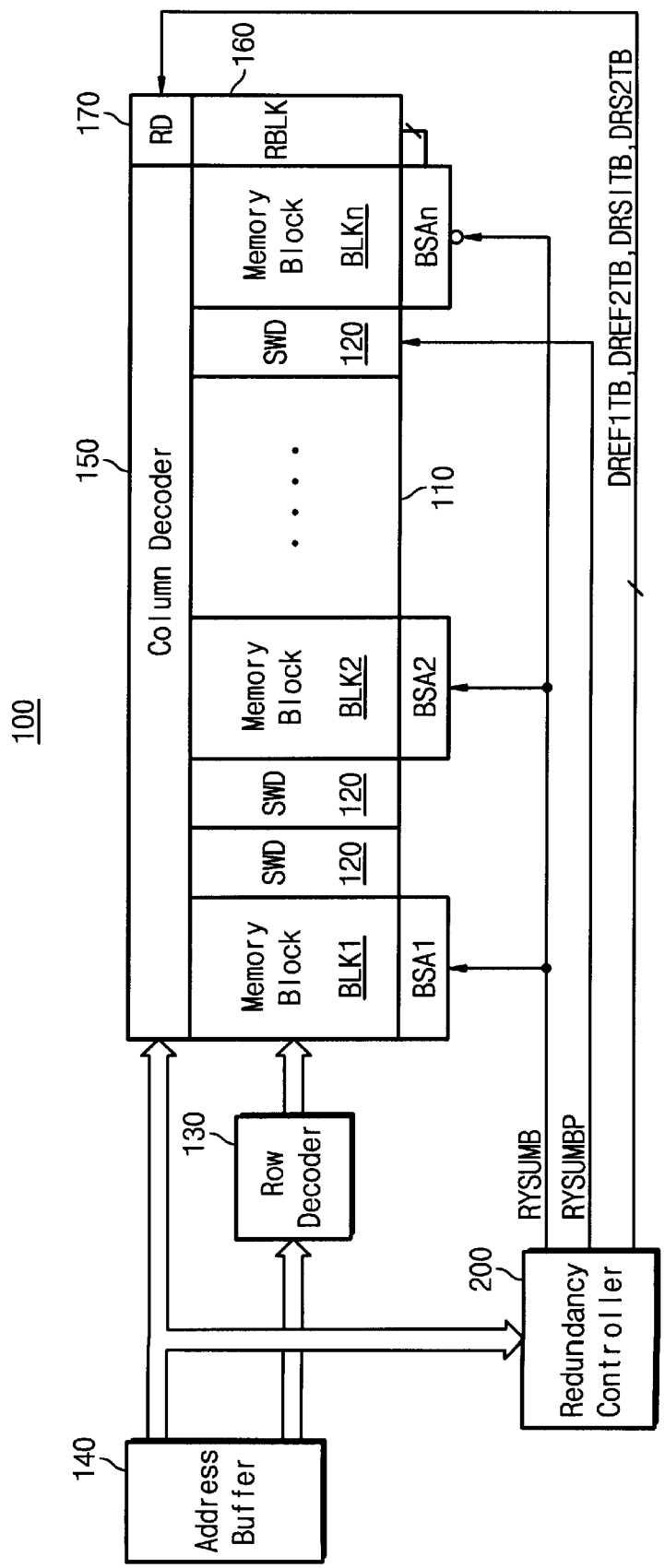
FIG. 1 is a block diagram of a semiconductor memory device according to the present invention.

A preferred embodiment of the present invention will be more fully described below with reference to the accompanying drawings. FIG. 1 is a block diagram of a semiconductor memory device 100 according to the present invention. In FIG. 1, a semiconductor memory device, for example, random access memory (RAM) device 100, is configured by using a well-known hierarchical word line scheme. The memory device 100 comprises a memory cell array 110 divided into a plurality of memory blocks BLK1 through BLKn (n is an integer). In the respective memory blocks BLK1 through BLKn, although not illustrated in FIG. 1, a plurality of memory cells for storing information are arranged at intersections of sub word lines and bit lines. Between the memory blocks BLK1 through BLKn, as shown in FIG. 1, a plurality of sub word line decoders (or section word line decoders) 120 are arranged so as to correspond to the memory blocks BLK1 through BLKn. The sub word lines provided in the respective memory blocks BLK1 through BLKn are selected by a row decoder 130 and a corresponding sub word line decoder 120 in accordance with a row address from an address buffer 140. The bit lines in the respective memory blocks BLK1 through BLKn are selected by a column decoder 150 according to a column address from the address buffer 140. Since a word line and bit line selecting operation is well known in the art, description thereof is omitted.

As illustrated in FIG. 1, a redundant memory block 160 shares the sub word lines of one of the memory blocks BLK1 through BLKn, for example, the memory block BLKn. The redundant memory block 160 includes redundant columns of redundant memory cells for replacing columns of one or more defective cells which occur in the memory blocks BLK1 through BLKn. The redundant memory cells in the redundant memory block 160 are fabricated using the same process—for example, CMOS fabrication process—used for fabricating the memory cells in the memory blocks BLK1 through BLKn. The random access memory device 100 of the present invention adopts a column redundancy where the redundant columns or bit lines in the redundant memory block 160 are selected using a redundant decoder circuit 170.

Block sense amplifier circuits BSA1 through BSAn are coupled to corresponding memory blocks BLK1 through BLKn, respectively. When one of the memory blocks BLK1 through BLKn is selected, the block sense amplifier circuit corresponding to the selected memory block senses and amplifies data in the selected memory block. Furthermore, the block sense amplifier circuit BSAn is coupled to both the memory block BLKn and the redundant memory block 160.

Referring to FIG. 1, in the random access memory device 100, a redundancy controller 200 is provided that generates a sense amplification control signal RYSUMB and a plurality of select signals RYSUMBP, DREF1TB, DREF2TB, DRS1TB and DRS2TB responsive to a column address from the address buffer 140. The sense amplification control signal RYSUMB is commonly provided to the block sense amplifier circuits BSA1 through BSAn. Note that the sense amplifier control signal RYSUMB is inverted and applied to the block sense amplifier circuit BSAn compared with other block sense amplifier circuits BSA1 through BSA(n-1). Therefore, when the sense amplifier control signal RYSUMB is activated (a redundancy is required), the block sense amplifier circuit BSAn is activated while other circuits BSA1 through BSA(n-1) are deactivated.

For example, when data is read out from or written to a defective memory cell of a column in the memory block BLK1, a main word line associated with the defective memory cell (although not shown, it is arranged through the memory blocks BLK1 through BLKn) is selected by the row decoder 130 and one of sub word lines (for example, 4 sub word lines) associated with the selected main word line is selected by the sub word line decoder 120 corresponding to the selected memory block BLK1. A column (or a bit line) coupled to the defective memory cell is selected by means of the column decoder 150. At the same time, the redundancy controller 200 generates a sense amplification control signal RYSUMB having a logic low level responsive to a column address. This forces the block sense amplifier circuits BSA1 through BSA(n-1) to be inactive and the block sense amplifier circuit BSAn to become active.

The column of the defective memory cell is replaced with a redundant column selected by the redundant decoder 170 according to the select signals DREF1TB, DREF2TB, DRS1TB and DRS2TB generated by the redundancy controller 200. At this time, because the redundant memory block 160 uses the same sub word line as the memory block BLKn, a sub word line of the memory block BLKn corresponding to a redundant memory cell to be replaced is selected by a corresponding sub word line decoder 120 according to the select signal RYSUMBP generated by the redundancy controller 200. Therefore, the defective memory cell of the memory block BLK1 is replaced with a redundant memory cell associated with the selected sub word line and the selected redundant column. Data in the addressed redundant memory cell is sensed and amplified by the block sense amplifier circuit BSAn activated by means of the sense amplification control signal RYSUMB.

Figure 2:
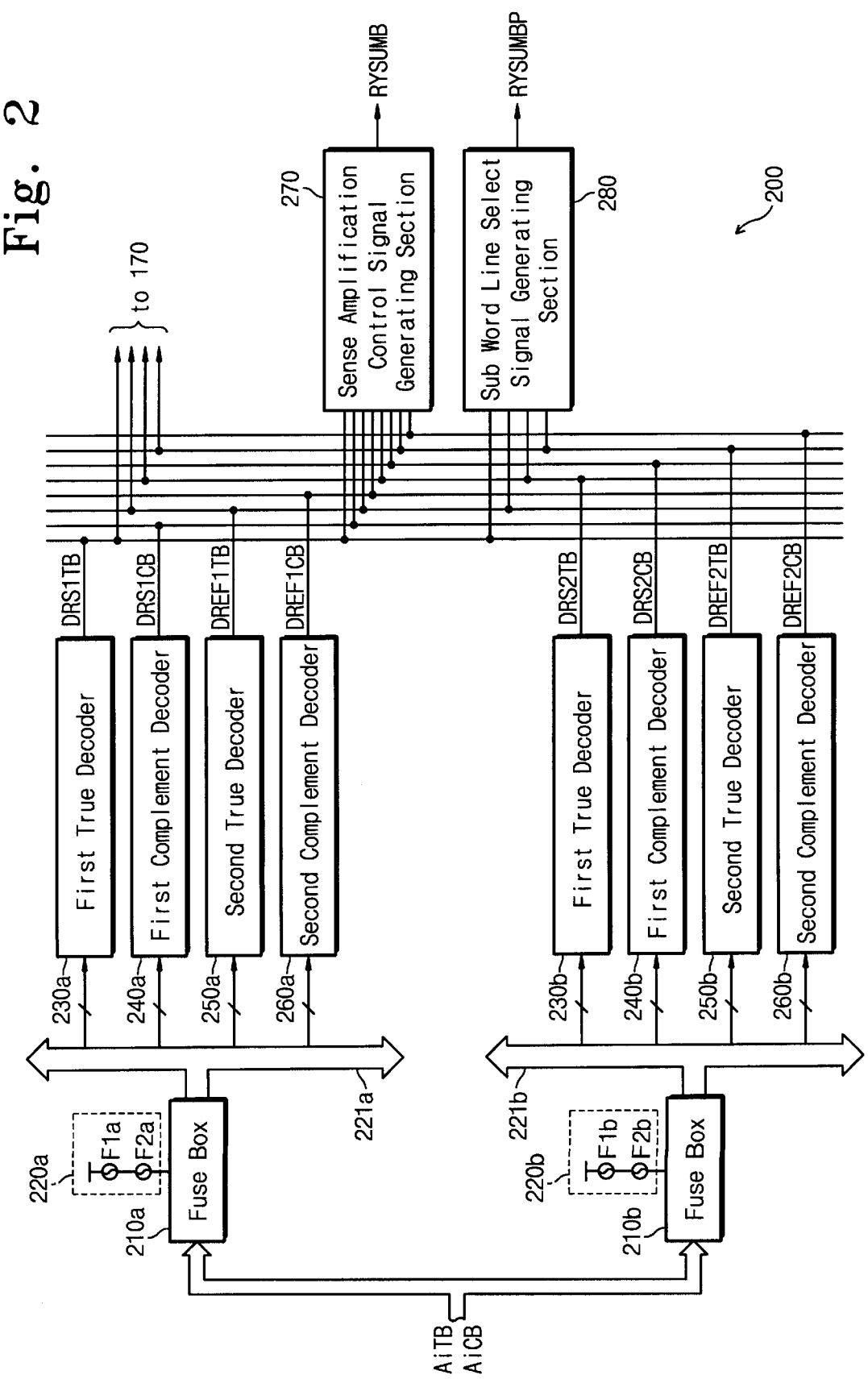
FIG. 2 is a block diagram of the redundancy controller shown in FIG. 1.

FIG. 2 is a block diagram of the redundancy controller 200 illustrated in FIG. 1. In this embodiment, assume that two redundant columns are provided in the redundant memory block 160. The redundancy controller 200 implemented under these conditions comprises two fuse boxes 210a and 210b and two redundancy enable circuits 220a and 220b coupled respectively to the fuse boxes 210a and 210b. The respective fuse boxes 210a and 210b receives true address signals A1TB through A7TB and complement address signals A1CB through A7CB and generates signals RSiTB (i=1, 2, 3), RSiCB, REjTB (j=1, 2), REjCB, RFjTB and RFjCB. The redundancy enable circuit 220a comprises a pair of fuses F1a and F2a coupled in series between a power supply voltage and a corresponding fuse box 210a. Similarly, the redundancy enable circuit 220b is comprised of a pair of fuses F1b and F2b coupled in series between the power supply voltage and a corresponding fuse box 210b.

Figure 3B:
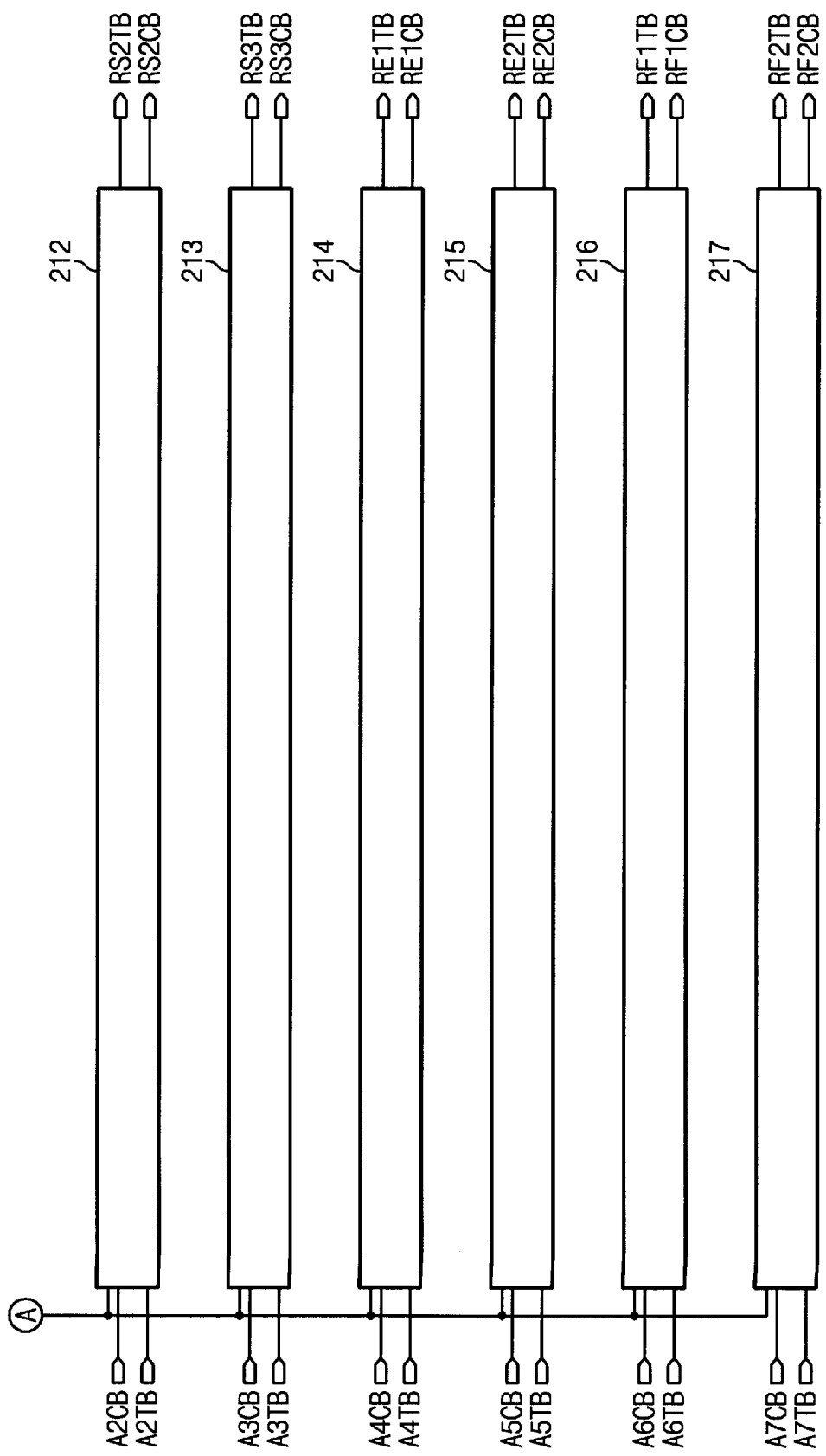

A detailed circuit diagram of the fuse box 210a according to the preferred embodiment of the present invention is illustrated in FIGS. 3A–3B. Although not shown in FIGS. 3A–3B, it should be obvious to a person skilled in the art that the fuse box 210b is configured the same as the fuse box 210a.

For each of illustration, a fuse box circuit 211 associated with a pair of true and complement address signals A1TB and A1CB is illustrated in FIGS. 3A–3B. However, it should be understood that fuse box circuits 212 through 217 associated with other pairs of true and complement address signals are configured the same as the fuse box circuit 211.

As illustrated in FIGS. 3A–3B, a fuse box circuit 211 is connected to the corresponding redundancy enable circuit 220a. When the fuses F1a and F2a are not cut, a signal line L1 is charged up to a logic high level (for example, a power supply voltage). On the other hand, when the fuses F1a and F2a are cut, the signal line L1 is at a floating state. An inverter INV1 and one NMOS transistor MN1 connected as illustrated in FIGS. 3A–3B constitute a latch circuit which is coupled to the signal line L1. An NMOS transistor MN2 is coupled between the signal line L1 and a ground voltage. The NMOS transistor MN2 is responsive to a signal POWERUP. In the case where the fuses F1a and F2a are cut, the signal line L1 is set at a logic low level (that is, the ground voltage level) via the NMOS transistor MN2 responsive to the signal POWERUP. In the fuse box circuit 211, two-input NOR gates G1 and G2 having first inputs coupled in common to the signal line L1 are provided. A second input of the NOR gate G1 is coupled to a node N1 and a second input of the NOR gate G2 is coupled to the node N1 via an inverter INV2. A fuse F3 is connected between the node N1 and the power supply voltage. One inverter INV3 and one NMOS transistor MN3 connected as illustrated in FIGS. 3A–3B constitute a latch circuit connected to node N1. An NMOS transistor MN4 is switched on/off in according to the signal POWERUP is coupled between the node N1 and the ground voltage. When the fuse F3 is cut, the node N1 is set at a logic low level via the NMOS transistor MN4 at the activation of the signal POWERUP and a logic level of the node N1 is held by the inverter INV3 and the transistor MN3.

Referring to FIGS. 3A–3B, the fuse box circuit 211 includes four transmission gates G3, G4, G5, and G6 and two inverters INV4 and INV5. The transmission gate G3 is connected between an input terminal T1 for receiving an input signal A1CB and an output terminal T3 for generating an output signal RS1TB. The transmission gate G3 has a first control terminal coupled to the output of the NOR gate G1 and a second control terminal coupled via the inverter INV4 to the output of the NOR gate G1. The transmission gate G4 is connected between an input terminal T2 for receiving an input signal A1TB and an output terminal T4 for generating an output signal RS1CB. The transmission gate G4 has a first control terminal coupled to the output of the NOR gate G1 and a second control terminal coupled via the inverter INV4 to the output of the NOR gate G1. The tranmission gate is coupled between the input terminal T1 and the output terminal T4. The transmission gate G6 has a first control terminal coupled to the output of the NOR gate G2 and a second control terminal coupled via the inverter INV5 to the output of the NOR gate G2. The transmission gate G5 is coupled between the input terminal T2 and the output terminal T3. The transmission gate G5 has a first control terminal coupled to the output of the NOR gate G2 and a second control terminal coupled via the inverter INV5 to the output of the NOR gate G2. The PMOS transistor MP1 whose gate is grounded has its channel coupled between the power supply voltage and the output terminal T3. Similarly, the PMOS transistor MP2 whose gate is grounded has its channel coupled between the power supply voltage and the output terminal T4.

The fuse box circuit 211 illustrated in FIGS. 3A–3B operates as follows. When a redundancy is required, that is, when the fuses F1a and F2a are cut, the signal line L1 is set at a logic low level via the NMOS transistor MN2 at power-up thereby making the first inputs of the NOR gates G1 and G2 be at a logic low, respectively. When the fuse F3 is not cut, the second inputs of the NOR gates G1 and G2 are set at a logic high level and at a logic low level in that order, respectively. Under these conditions, the transmission gates G3 and G4 are deactivated and the transmission gates G5 and G6 are activated. The input terminal T1 is coupled to the output terminal T4 via the transmission gate G6 and the input terminal T2 is coupled to the output terminal T3 via the transmission gate G5. As a result, a true address signal A1TB is outputted as a true address signal RS1TB and a complement address signal A1CB is outputted as a complement address signal RS1CB.

When the fuse F3 is cut, the node N1 is grounded via the NMOS transistor MN4 responsive to the activation of the signal POWERUP. Therefore, the second inputs of the NOR gates G1 and G2 are set at a logic low and high level, respectively. Under these conditions, the transmission gates G3 and G4 are activated and the transmission gates G5 and G6 are deactivated. Thus, the input terminal T1 is coupled to the output terminal T3 via the transmission gate G3 and the input terminal T2 is coupled to the output terminal T4 via the transmission gate G4. As a result, a true address signal A1TB is outputted as a complement address signal RS1CB and a complement address signal A1CB is outputted as a true address signal RS1TB.

If the fuses F1a and F2a of the redundancy enable circuit 220a are not cut, the signal line L1 continues to be set at a logic high level. The logic level of the signal line L1 forces the first inputs of the NOR gates G1 and G2 at a logic high thereby deactivating the transmission gates G3, G4, G5 and G6. That is, no redundancy is performed.

Referring to FIG. 2, the redundancy controller 200 further comprises first true and complement decoders 230a and 240a and second true and complement decoders 250a and 260a coupled to the fuse box 210a through a bus 221a. The first true and complement decoders 230b and 240b and second true and complement decoders 250b and 260b are coupled to the fuse box 210b through a bus 221b. The decoders will be more fully described below with reference to FIGS. 4, 5, 6, and 7.

Figure 4:
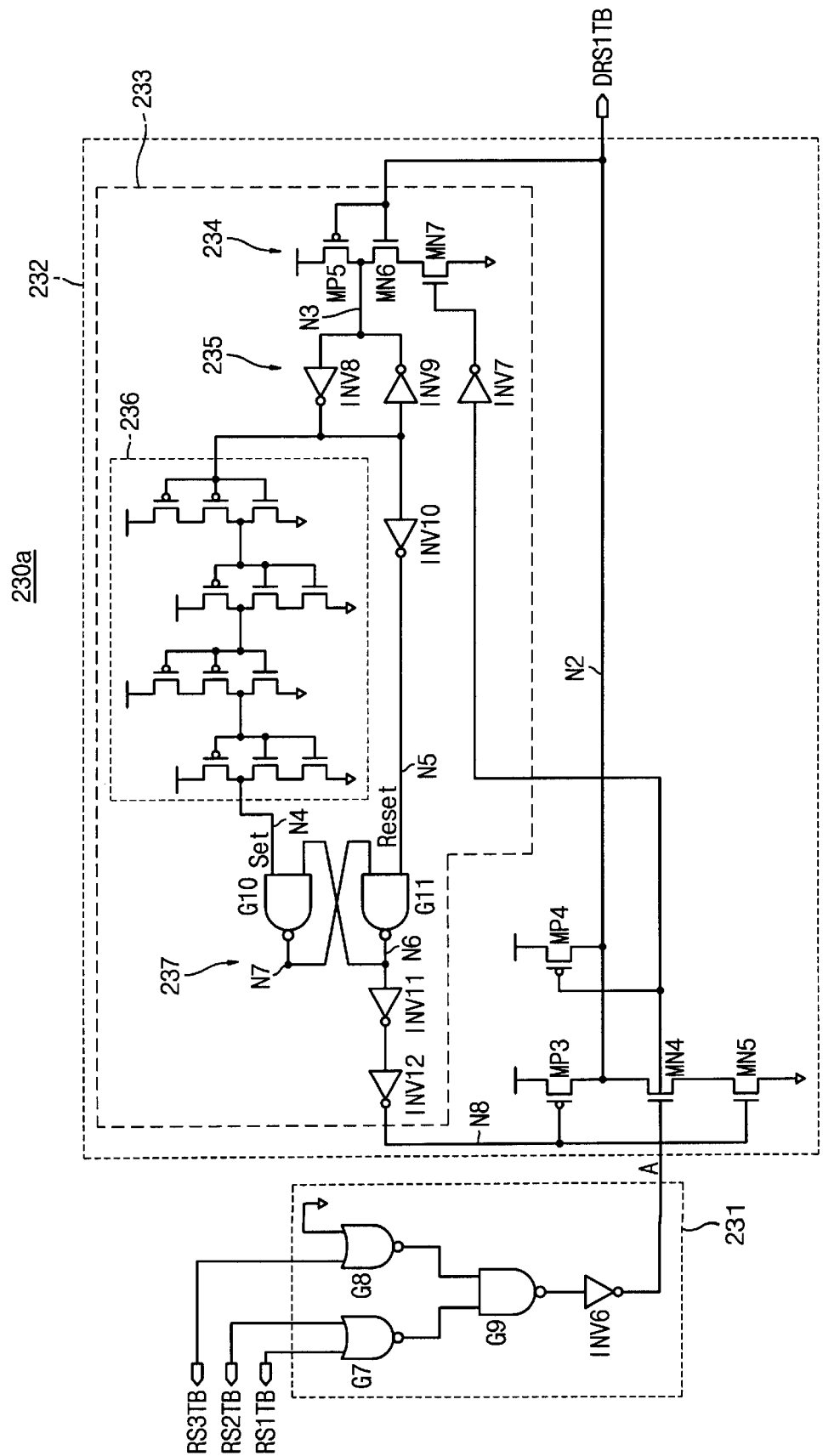
FIG. 4 is a detailed circuit diagram of the first true decoder shown in FIG. 2 according to a preferred embodiment of the present invention.

Referring to FIG. 4, the first true decoder 230a receives output signals RS1TB, RS2TB and RS3TB from the fuse box 210a and generates a decoded signal DRS1TB having a pulse form. Although not shown in the drawing, the first true decoder 230b corresponding to the fuse box 210b may be configured the same as the decoder 230a.

The first true decoder 230a comprises a logic circuit 231 and a dynamic inverter circuit 232. The logic circuit 231 decodes true address signals RS1TB, RS2TB and RS3TB to output a decoded output signal A. The logic circuit 231 comprises the two-input NOR gates G7 and G8, two-input NAND gate G9 and an inverter INV6 connected as illustrated in FIG. 4. The true address signals RS1TB, RS2TB, and RS3TB are address signals associated with block select information among the true and complement address signals AiTB and AiCB. When all of the signals RS1TB, RS2TB and RS3TB are at a logic low level, the decoded output signal A from the logic circuit 231 is pulsed high. That is, the output signal A is activated. On the other hand, when anyone of the signals RS1TB, RS2TB and RS3TB is high, the signal A from the logic circuit 231 is maintained low.

The dynamic inverter circuit 232 generates an output pulse signal DRS1TB when the signal A from the logic circuit 231 is activated high. The output signal DRS1TB is active low. While the signal A is maintained low, the node N2 is precharged at the power supply voltage level via a PMOS transistor MP4. The node N2 serves as the output terminal for outputting the signal DRS1TB. The channels of NMOS transistors MN4 and MN5 are connected in series between the node N2 and the ground voltage. The gate of the transistor MN4 is connected to the signal A and the gate of the transistor MN5 is coupled to an output N8 of a self-reset circuit 233. A channel of a PMOS transistor MP3 is coupled between the power supply voltage and the node N2 and a gate thereof is connected to the output N8 of the self-reset circuit 233.

The self-reset circuit 233 performs stable self-reset operation regardless of the pulse width (duty) of the input signal A, the period of the input signal A, and a delay time for determining the pulse width of the signal DRS1TB. The self-reset circuit 233 comprises a blocking circuit 234, a latch circuit 235, a delay circuit 236, a flip flop 237, and three inverters INV10, INV11, and INV12.

The blocking circuit 234 has a PMOS transistor MP5, two NMOS transistors MN6 and MN7, and an inverter INV7 connected as illustrated in FIG. 4. When the node N2 transitions from a precharge state (for example, a logic high level) to a discharge state (for example, a logic low level) at the activation of the signal A, the circuit 234 connects the node N2 to the latch circuit 235. When the node N2 transitions from the discharge state to the precharge state during the activation of the signal A, the circuit 234 prevents transferring the precharge state of the node N2 to the latch circuit 235. On the other hand, the circuit 234 transfers the precharge state of the node N2 to the latch circuit 235 during the deactivation of the signal A.

The flip flop 237 has two-input NAND gates G10 and G11. The set terminal of the flip flop 237 comprises a first input of the NAND gate G10 that is connected to the latch circuit 235 via the delay circuit 236. As a reset terminal of the flip flop 237, one input of the NAND gate G11 is coupled to the latch circuit 235 via the inverter INV10.

The first true decoder 230a operates as follows. When one of the signals RS1TB, RS2TB, and RS3TB inputted to the logic circuit 231 is maintained high, the signal A from the logic circuit 231 is low. At this time, the node N2 is precharged at a logic high level via the transistor MP4. If the node N8 is at a logic high level, the PMOS transistor MP3 is turned off and the NMOS transistor MN5 is turned on. Under these conditions, when all of the input signals RS1TB, RS2TB and RS3TB transition from a logic high level to a logic low level, the signal A changes to a logic high level. This turns on the NMOS transistor MN4 discharging the node N2.

The self-reset circuit 233 responds to the node N2 potential and activates the PMOS transistor MP3 and deactivates the NMOS transistor MN5 after the time for determining the pulse width of the signal DRS1TB elapses. The more detailed description of the self-reset circuit 233 is as follows. Since the node N2 changes to a logic low level, the PMOS transistor MP5 is turned on, and the node N3 is charged at a logic high level. The reset terminal of the flip flop 237 transitions from a logic low level to a logic high level through the inverter INV10. However, an output signal at the node N6 continues to be high though the input signal of the reset terminal makes a low-to-high transition. This is because the output of the flip flop configured by means of the NAND gates changes only when its input transitions from a logic high level to a logic low level.

After the delay time generates by the delay circuit 236 lapses, the set terminal transitions from a logic high level to a logic low level. The node N7 changes from a logic low level to a logic high level, such that the node N6 changes to a logic low level. Therefore, the node N2 is precharged high through the PMOS transistor MP3. After this, a self-reset operation for activating the NMOS transistor MN5 and deactivating the PMOS transistor MP3 is performed as follows.

The logic high level of the precharged node N2 is applied to the block circuit 234, such that the NMOS transistor MN6 is turned on. If the signal A is maintained high after the node N2 is again precharged high, the node N2 is electrically disconnected from the latch circuit 235. On the other hand, if the signal A is deactivated low, the node N3 (an input of the latch circuit 235) transitions from a logic high level to a logic low level through the NMOS transistors MN6 and MN7.

The output (high) of the latch circuit 235 is applied to the reset terminal of the flip flop 237 via the inverter INV10. That is, the reset terminal transitions from a logic high level to a logic low level. This enables the node N6 to transition from a logic low level to a logic high level regardless of the level change of the set terminal. Therefore, the NMOS transistor MN5 is turned on and the PMOS transistor MP3 is turned off. That is, the self-reset operation ends before the next logic low to a logic high transition of the signal A. According to the above described process, the first true decoder 230a generates its decoded signal PRS1TB without a signal delay.

Figure 5:
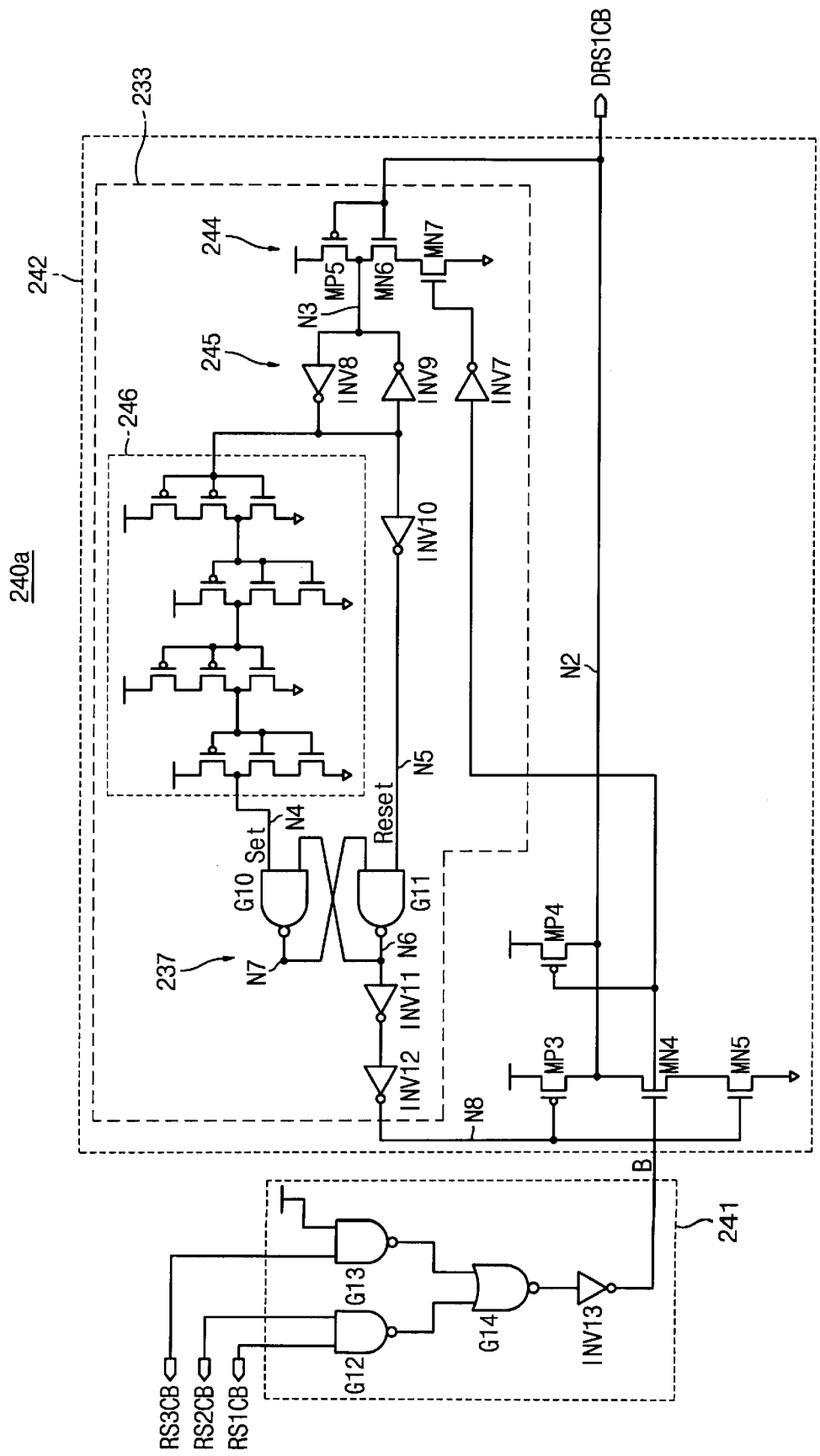
FIG. 5 is a detailed circuit diagram of the first complement decoder shown in FIG. 2 according to a preferred embodiment of the present invention.

Referring to FIG. 5, a detailed circuit diagram of a first complement decoder 240a corresponding to the fuse box 210a is illustrated. Although not shown in the drawing, the first complement decoder 240b corresponding to the fuse box 210b may be configured the same as the decoder 240a shown.

The first complement decoder 240a comprises a logic circuit 241 and a dynamic inverter circuit 242. The logic circuit 241 decodes complement address signals RS1CB, RS2CB, and RS3CB from the fuse box 210a to output a decoded output signal B. The logic circuit 241 has two-input NAND gates G12 and G13, two-input NOR gate G14, and one inverter INV13 connected as illustrated in FIG. 5. The address signals RS1CB, RS2CB, and RS3CB are address signals associated with block select information among the true and complement address signals AiTB and AiCB.

When one of the signals RS1CB, RS2CB and RS3CB is low, the signal B from the logic circuit 241 turns to a logic high level (that is, it is activated). On the other hand, when all of the signals RS1CB, RS2CB, and RS3CB turns it is deactivated to a logic low level, the signal B from the logic circuit 241 is maintained low. Since the dynamic inverter circuit 242 shown in FIG. 5 is configured the same as that shown in FIG. 4, description thereof is thus omitted. The first complement decoder 240a generates its output signal DRS1CB in the same manner as that of the circuit shown in FIG. 4. Description thereof is thus omitted. According to the decoder structure, the decoded signal DPRS1CB is generated without signal delay.

Figure 6:
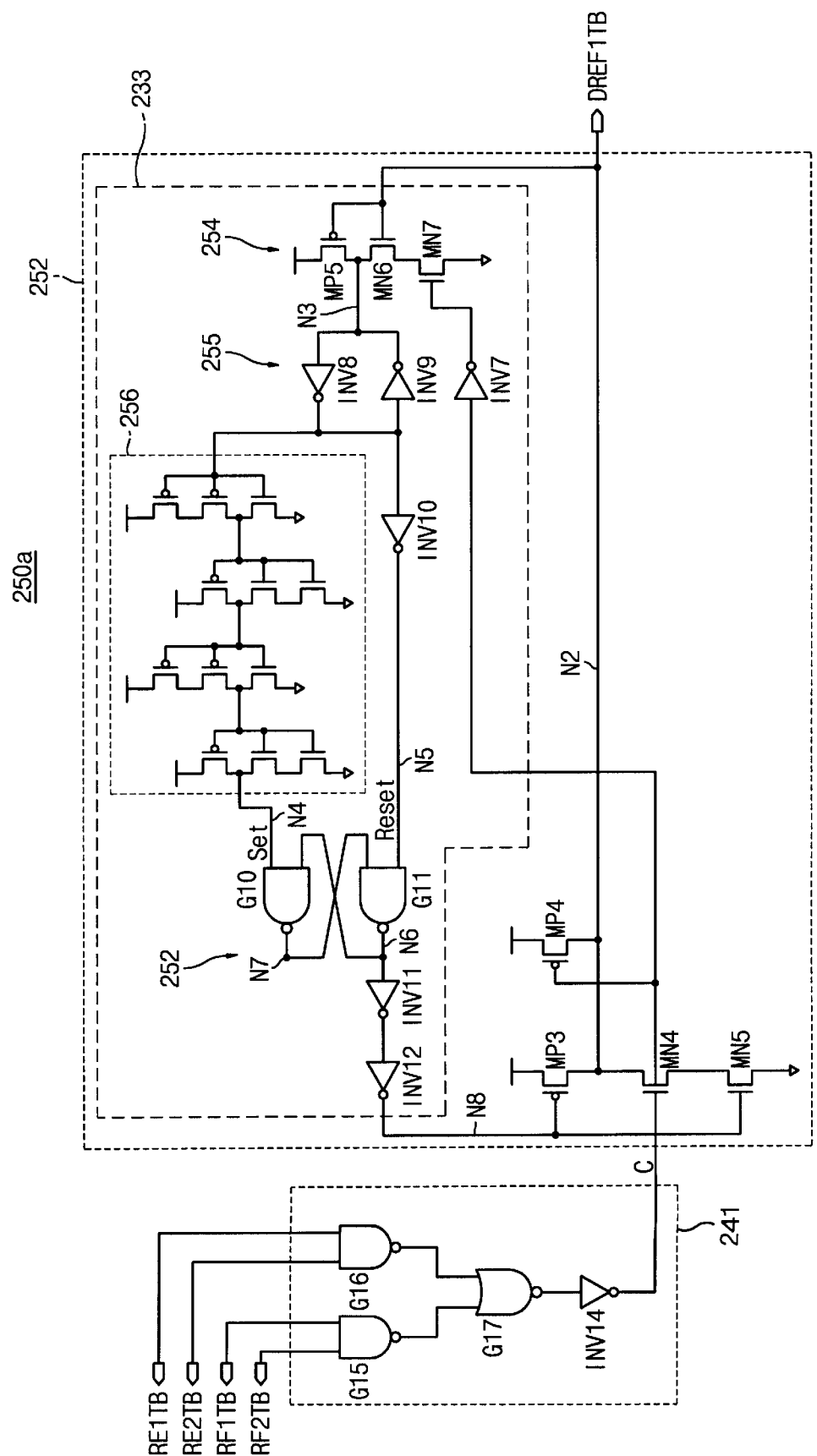
FIG. 6 is a detailed circuit diagram of the second true decoder shown in FIG. 2 according to a preferred embodiment of the present invention.

Referring to FIG. 6, a detailed circuit diagram of a second true decoder 250a corresponding to the fuse box 210a is illustrated. Although not shown in the drawing, the second true decoder 250b corresponding to the fuse box 210b may be configured the same as the decoder 250a shown in FIG. 6. Similarly to the first true and complement decoders, the second true decoder 250a comprises of a logic circuit 251 and a dynamic inverter circuit 252. The logic circuit 251 decodes true address signals RF1TB, RF2TB, RE1TB, and RE2TB from the fuse box 210a to output a decoded signal C. The logic circuit 251 has two-input NAND gates G15 and G16, two-input NOR gate G17 and one inverter INV14 connected as illustrated in FIG. 6. The true address signals RF1TB and RF2TB are a part of address signals associated with column select information from the fuse box 210a. The true address signals RE1TB and RE2TB are part of address signals associated with column select information from the fuse box 210b.

When all of the signals RF1TB, RF2TB, RE1TB, and RE2TB change to a logic low level, the signal C from the logic circuit 251 change to a logic high level (that is, activated). On the other hand, when one of the signals RF1TB, RF2TB, RE1TB, and RE2TB changes to a logic high level, the signal C from the logic circuit 251 is maintained low (that is, deactivated). Since the dynamic inverter circuit 252 shown in FIG. 6 is configured the same as that shown in FIG. 4, description thereof is thus omitted. Furthermore, the second true decoder 250a generates its output signal DRER1TB in the same manner as that shown in FIG. 4. Description thereof is thus omitted. According to the decoder structure, the decoded signal DREF1TB is generated without signal delay.

Figure 7:
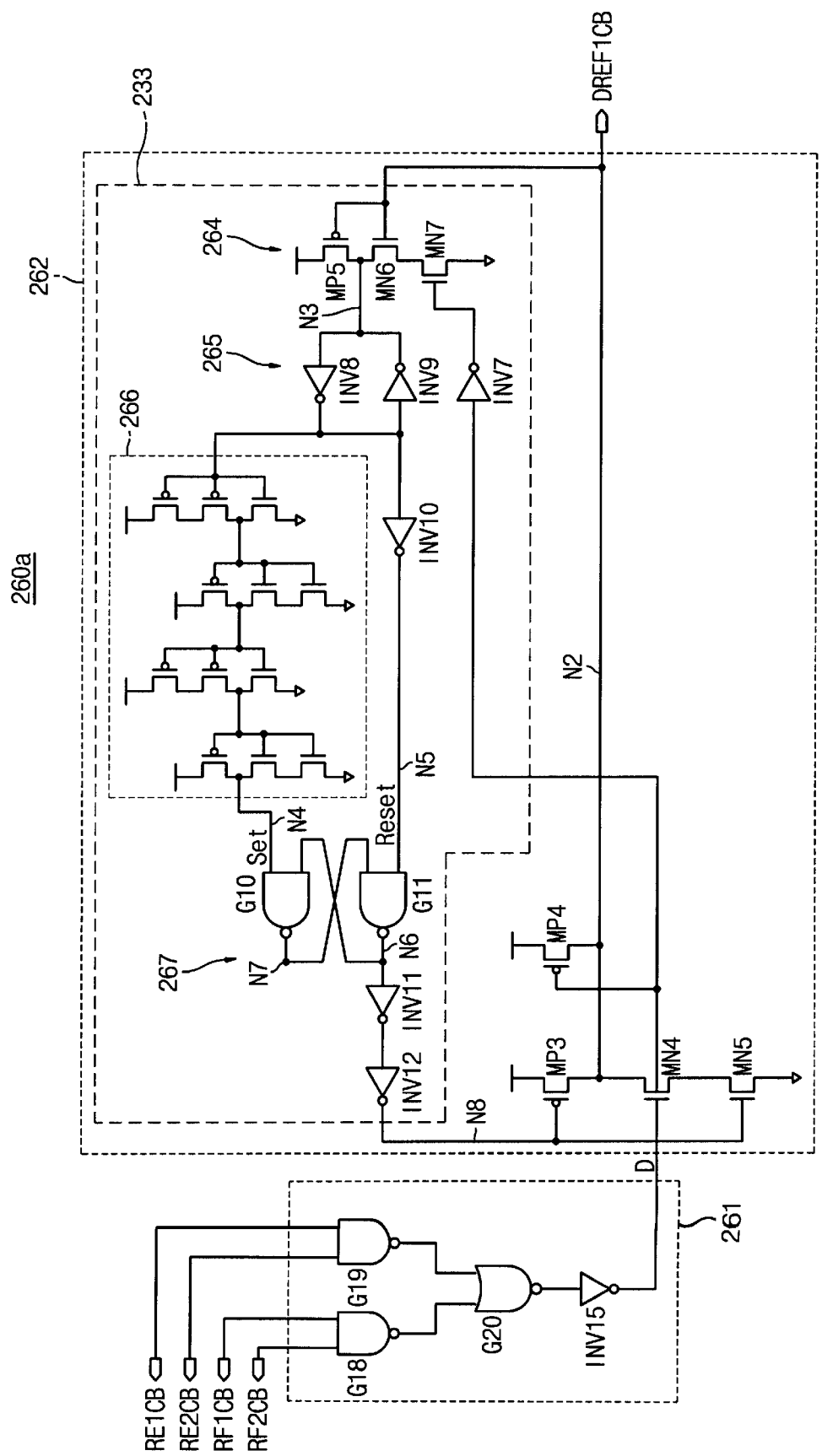
FIG. 7 is a detailed circuit diagram of the second complement decoder shown in FIG. 2 according to a preferred embodiment of the present invention.

Referring to FIG. 7, a detailed circuit diagram of a second complement decoder 260a corresponding to the fuse box 210a is illustrated. Although not shown in the drawing, the second true decoder 260b corresponding to the fuse box 210b may be configured the same as the decoder 260a shown in FIG. 7.

The second true decoder 260a comprises a logic circuit 261 and a dynamic inverter circuit 262. The logic circuit 261 decodes complement address signals RF1CB, RF2CB, RE1CB, and RE2CB from the fuse box 210a to output a decoded signal D, and has two-input NAND gates G18 and G19, two-input NOR gate G20 and one inverter INV15 connected as illustrated in FIG. 7. The complement address signals RF1CB and RF2CB are a part of address signals associated with column select information from the fuse box 210a. The true address signals RE1CB and RE2CB are part of the address signals associated with column select information from the fuse box 210b.

When one of the signal RF1CB, RF2CB, RE1CB, and RE2CB changes to a logic low level, the signal D from the logic circuit 261 changes to a logic high level (that is, activated). On the other hand, when all of the signals RF1CB, RF2CB, RE1CB, and RE2CB changes to a logic high level, the signal D from the logic circuit 261 is maintained low (that is, inactivated). Since the dynamic inverter circuit 262 shown in FIG. 7 is configured the same as that of the circuit shown in FIG. 4. Description thereof is thus omitted. Furthermore, the second complement decoder 260a generates its output signal DRER1CB in the same manner as that shown in FIG. 4, and description thereof is thus omitted. According to the decoder structure, the decoded signal DREF1CB is generated without signal delay.

Referring again to FIG. 2, the redundancy controller 200 further comprises a sense amplification control signal generating section 270, which generates a sense amplification control signal RYSUMB for controlling the block sense amplifiers BSA1 through BSAn responsive to the signals DRS1TB, DRS1CB, DREF1TB, DRS2TB, DRS2CB, DREF2TB and DREF2CB from the decoders 230a/b, 240a/b, 250a/b and 260a/b. A detailed circuit diagram of the section 270 is illustrated in FIG. 8.

Figure 8:
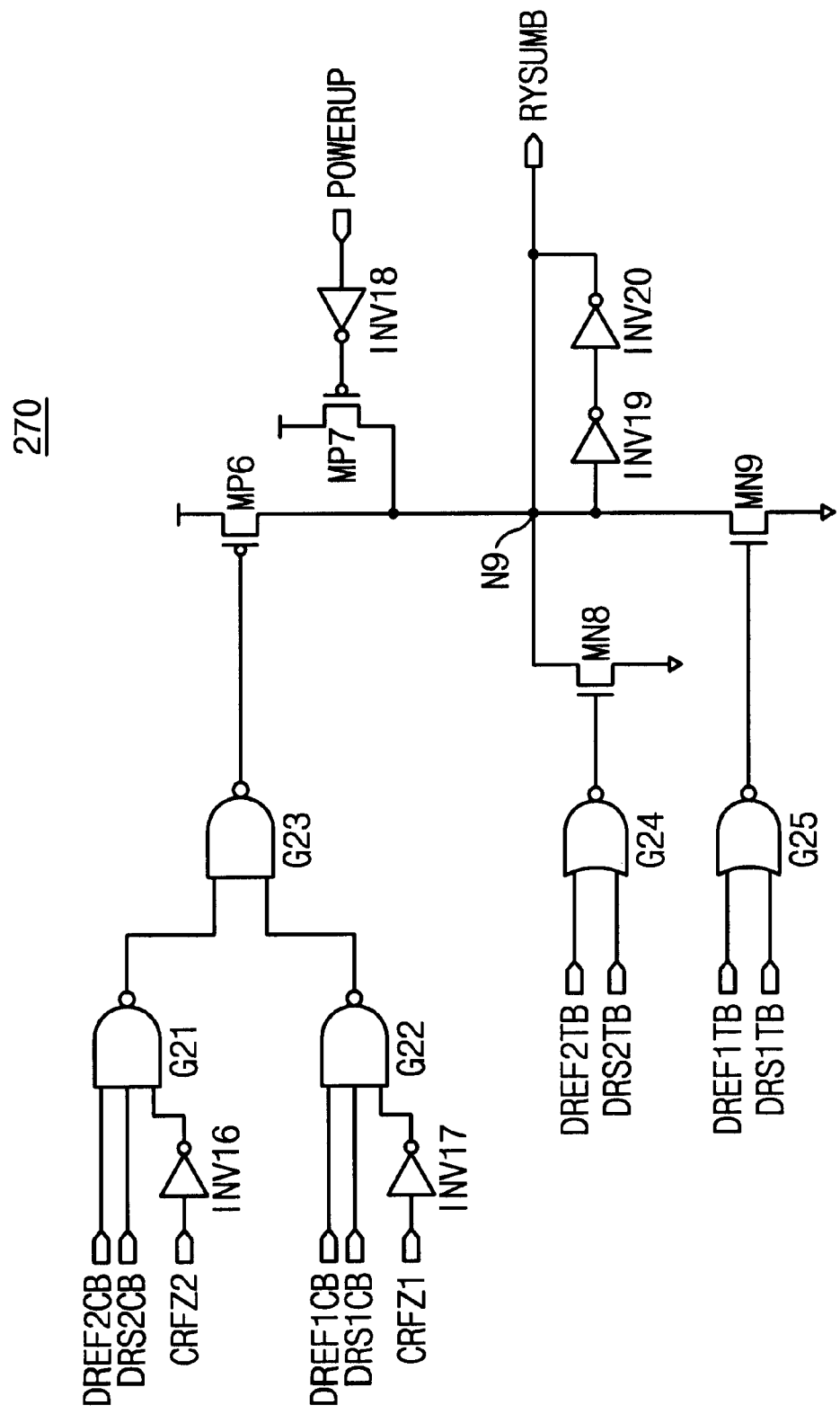
FIG. 8 is a detailed circuit diagram of the sense amplification control signal generating section shown in FIG. 2 according to a preferred embodiment of the present invention.

Referring to FIG. 8, the sense amplification control signal generating section 270 comprises three NAND gates G21, G22 and G23, two NOR gates G24 and G25, five inverters INV16 through INV20, two PMOS transistors MP6 and MP7, and two NMOS transistors MN8 and MN9.

The NMOS transistor MN8 is connected between the node N9 (terminal for generating the signal RYSUMB) and a ground voltage. A gate of the transistor MN8 is connected to an output terminal of the NOR gate G24. The NOR gate 24 decodes the input signals DREF2TB and DRS2TB. The NMOS transistor MN9 whose gate is coupled to an output terminal of the NOR gate G25 is connected between the node N9 and the ground voltage. The NOR gate G25 decodes the input signals DREF1TB and DRS1TB and generates a decoded signal to the gate of the NMOS transistor MN9. The transistors MN8 and MN9 serve as a pull-down transistors.

The PMOS transistor MP6 acts as a pull-up transistor. The PMOS transistor MP6 is connected between the power supply voltage and the node N9. A gate of the transistor MP6 is coupled to output of the NAND gate-G23. The NOR gate G21 receives and decodes signals DREF2CB and DRS2CB and a signal CRFZ2 via the inverter INV16 and provides the decoded signal to an input of the NAND gate G23. The NOR gate G22 receives and decodes signals DREF1CB and DRS1CB and a signal CRFZ1 via the inverter INV17 and provides the decoded signal to another input of the NAND gate G23.

Between the power supply voltage and the node N9, the PMOS transistor MP7 is connected whose gate receives the signal POWERUP via the inverter INV18. The inverters INV19 and INV20 and the node N9 constitute a latch. At the activation of the signal POWERSUP (at power up), the node N9 is precharged at a logic high level through the transistor MP7. The potential of the node N9 is latched by means of the inverters INV19 and INV20.

In this embodiment, the signal CRFZ1 indicates that the fuses F1a and F2a of the fuse box 210a are cut. The signal CRFZ2 indicates that the fuses F1b and F2b of the fuse box 210b are cut. For example, when the fuses F1a, F2a, F1b, and F2b are not cut, the signals CRFZ1 and CRFZ2 change to a logic high level, respectively. On the other hand, when the fuses F1a and F2a, or F1b, and F2b are cut, the signal CRFZ1 or CRFZ2 changes to a logic low level.

Figure 9:
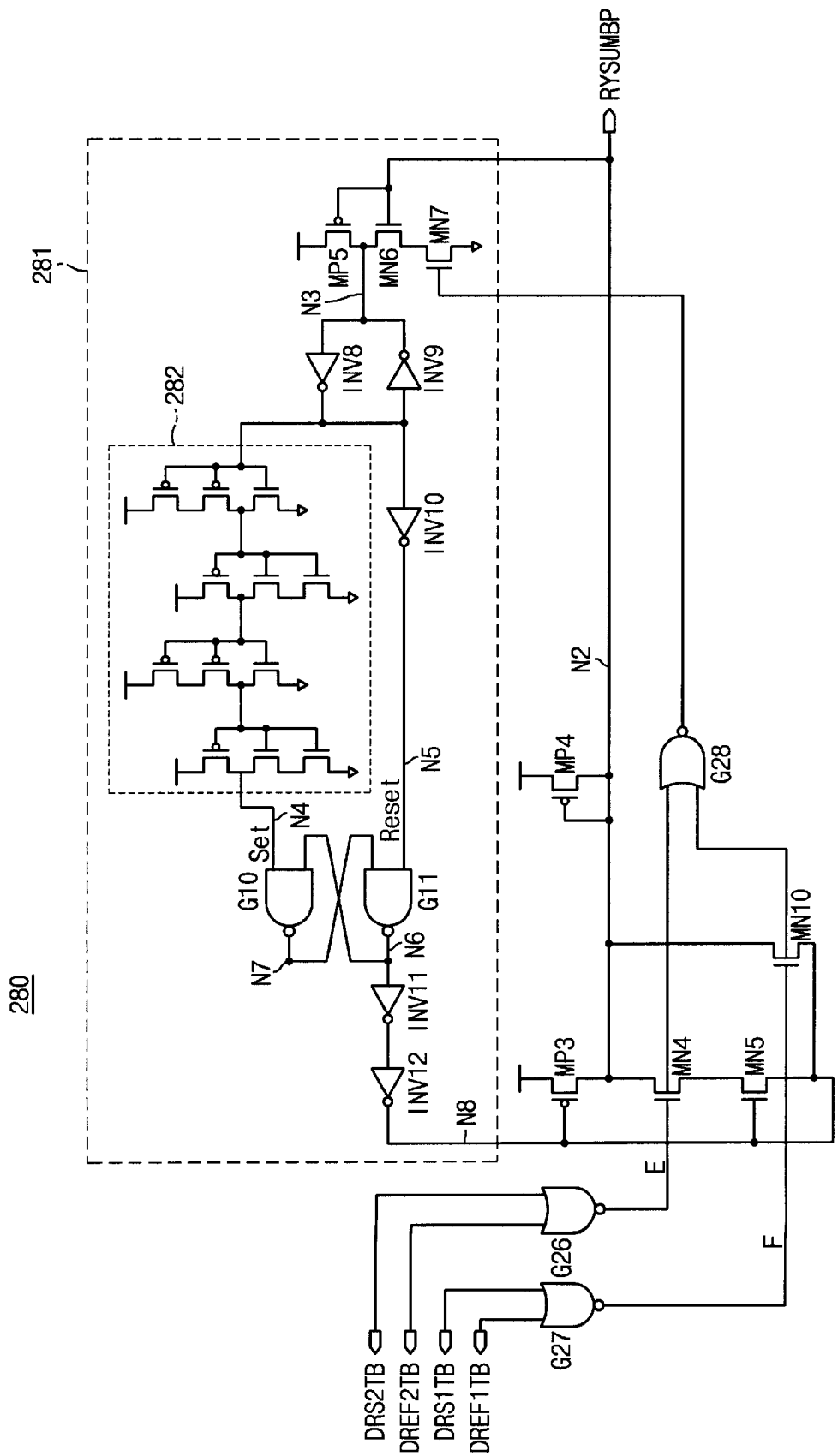
FIG. 9 is a detailed circuit diagram of the sub word line select signal generating section shown in FIG. 2 according to a preferred embodiment of the present invention.

Returning to FIG. 2, the redundancy controller 200 further comprises a sub word line select signal generating section 280, which generates a sub word line select signal RYSUMBP responsive to the pulse signals DREF1TB, DRS1TB, DREF2TB, and DRS2TB. The pulse signals DREF1TB, DRS1TB, DREF2TB, and DRS2TB are active low. Referrign to FIG. 9, the sub word line select signal generating section 280 comprises three NOR gates G26, G27 and G28, three NMOS transistors MN4, MN5 and MN10, two PMOS transistors MP3 and MP4, and a self-reset circuit 281 connected as depicted in FIG. 9.

Figure 10A:
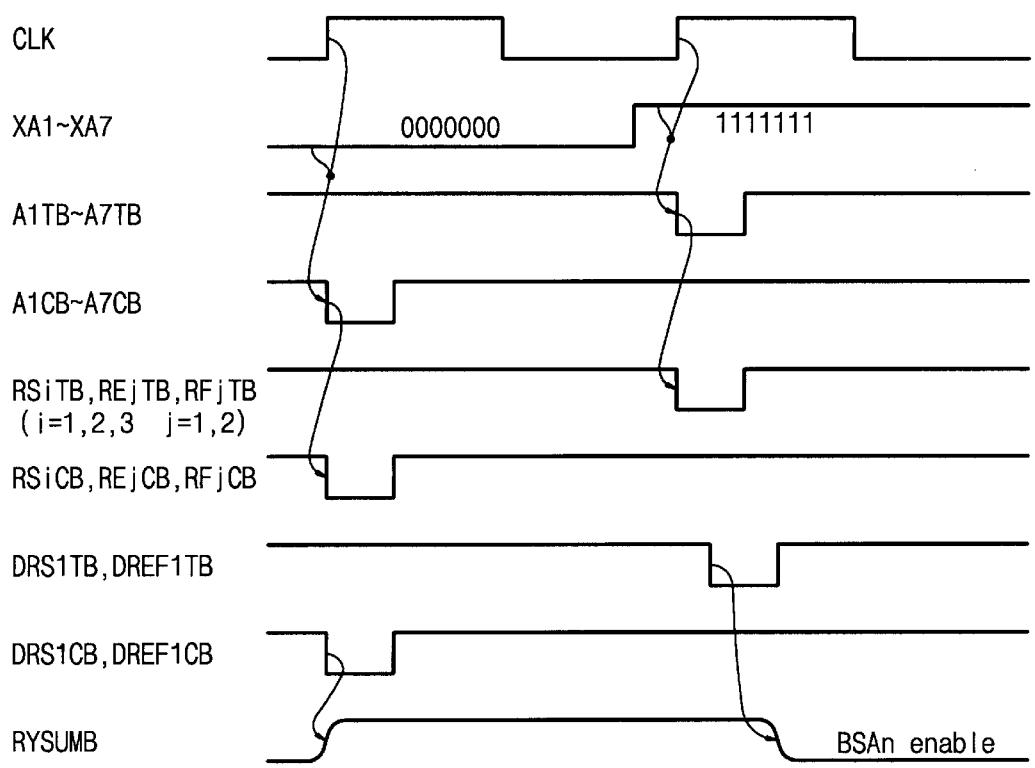
FIGS. 10A and 10B are timing diagrams for describing a redundancy operation according to the present invention.
Figure 10B:
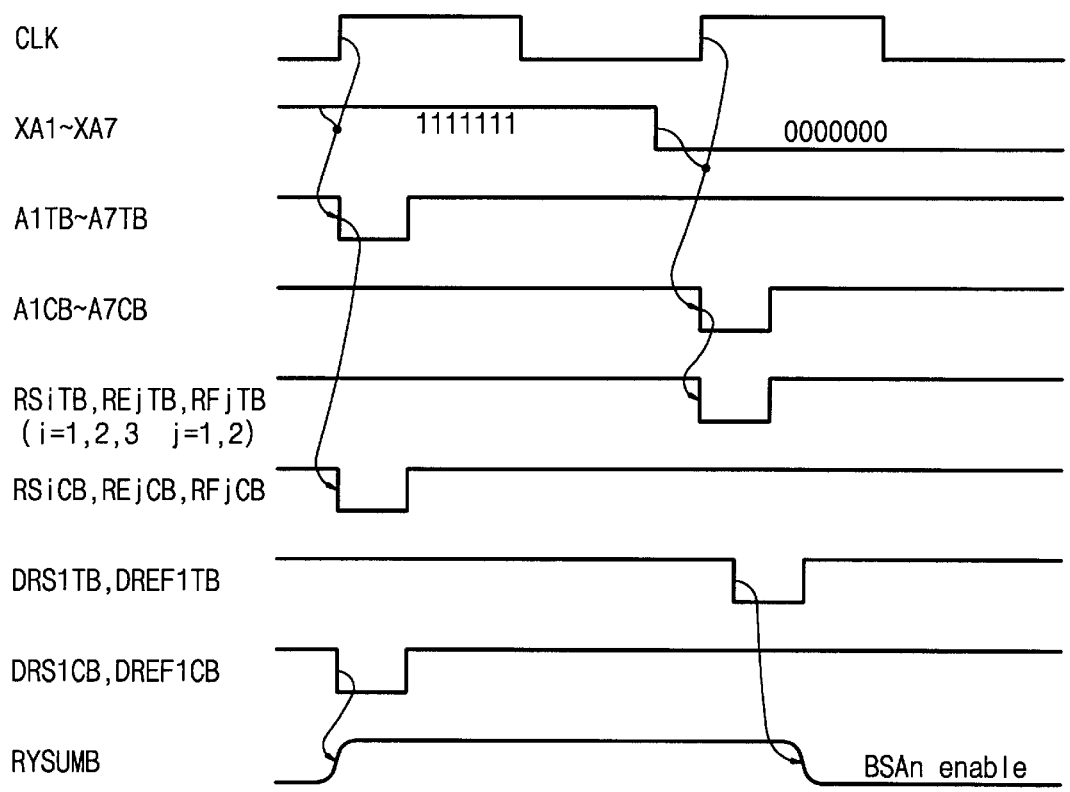

FIGS. 10A and 10B are timing diagrams for describing a redundancy operation according to the semiconductor memory device of the present invention. Assume that a 7-bit column address is externally provided to the random access memory synchronized with the clock signal CLK and that two redundant columns are provided in the redundant memory block 160 shown in FIG. 1. Referring to FIG. 10A, after a first column address of "0000000" is provided, a second column address of "1111111" is inputted. Under these conditions, the second column address of "1111111" may be associated with a column of at least one defective memory cell in a selected memory block. That is, a column in the selected memory block corresponding to the first column address is normally selected during a read/write cycle and a column in the selected memory block corresponding to the second column address may be replaced with a column in the redundant memory block.

The address buffer 140 receives the second column address of "11111111" to output true address signals A1TB through A7TB of "0000000" and complement address signals A1CB through A7CB of "1111111", as shown in FIG. 10A. That is, if an address signal XAi in a logic one state, the true address signal AiTB from the address buffer 140 is pulsed. If an address signal XAi is in a logic zero state, the complement address signal AiCB from the address buffer 140 is pulsed. The true and complement address signals A1TB through A7TB and A1CB through A7CB thus generated are provided into the redundancy controller 200.

In this embodiment, in the case where an address signal XAi is at a logic one state, the fuse F3 of a fuse box circuit corresponding to the address signal XAi is not cut. On the other hand, when an address signal XAi is at a logic zero state, the fuse F3 of a fuse box circuit corresponding to the address signal XAi is cut.

For the purpose of description, assume that the fuses F1a and F2a in the redundancy enable circuit 220a are cut. Therefore, the signal line L1 connected in common to the fuse box circuits 211 through 217 corresponding to the circuit 220a is set at a logic low at power up as set forth above. According to the above mentioned conditions, since all of the fuses F3 in the fuse box 210a are not cut, the input terminals of the NOR gate G1 in the respective fuse box circuits 211 through 217 are set at a logic low and high, respectively, and all of the input terminals of the NOR gate G2 are set to a logic low. These conditions activate the transmission gates G5 and G6 and deactivate the transmission gates G3 and G4. As a result, true address signals are outputted from the fuse box 210a as corresponding true addresses signals, respectively, and complement address signals are outputted from the fuse box 210a as corresponding complement address signals, respectively. Thus, as shown in FIG. 10A, true address signals RS1TB, RS2TB, RS3TB, RE1TB, RE2TB, RF1TB, and RF2TB from the fuse box 210a turn to a logic zero state, respectively, and complement address signals RS1CB, RS2CB, RS3CB, RE1CB, RE2CB, RF1CB, and RF2CB from the fuse box 210a turn to a logic one state, respectively.

The first true decoder 230a generates the decoded signal DRS1TB having an active low pulse form responsive to the true address signals RS1TB, RS2TB and RS3TB which are all at a logic zero state. On the other hand, the decoded signal DRS1CB from the first complement decoder 240a is maintained high (indicating a deactivated state) by means of the complement address signals RS1CB, RS2CB, and RS3CB that are at a logic one state, respectively. Similarly, the second true decoder 250a generates the decoded signal DREF2TB of an active low pulse form responsive to the true address signals RE1TB, RE2TB, RE1TB and RF2TB that are at a logic zero state, respectively. On the other hand, the decoded signal DREF1CB from the second complement decoder 260a is maintained high (indicating a deactivated state) by means of the complement address signals RE1CB, RE2CB, RF1CB and RF2CB that are at a logic one state, respectively.

Since the fuses F1b and F2b of the redundancy enable circuit 220b are not cut, the signal line L1 associated with the fuse box 210b is set high. Therefore, all of the transmission gates G3 through G6 are deactivated, thereby making their corresponding output signals be maintained at a deactivated state, respectively. As a result, the decoded signals DRS2TB, DRS2CB, DREF2TB, and DREF2CB from the decoders 230b, 240b, 250b, and is 260b corresponding to the fuse box 210b continue to be maintained high.

Continuously, the sense amplification control signal generating section 270 makes the sense amplification control signal RYSUMB of an active low pulse form responsive to the decoded signals DREF1TB, DREF2TB, DRS1TB and DRS2TB each having a logic zero state. In particular, in accordance with the decoded signals DREF1TB, DREF2TB, DRS1TB and DRS2TB, the outputs of the NOR gates G24 and G25 transition from a logic low level to logic high level, respectively. This makes the NMOS transistors MN8 and MN9 be turned on, so that the control signal RYSUMB is active low. On the other hand, the PMOS transistor MP6 is deactivated because the decoded signals DREF1CB, DREF2CB, DRS1CB and DRS2CB are at a logic high level, respectively.

Furthermore, the redundant decoder 170 selects one of the two redundant columns responsive to the decoded signals DRS1TB, DRS2TB, DREF1TB and DREF2TB from the decoders corresponding to the fuse box 210a. At the same time, the sub word line select signal generating section 280 generates the sub word line select signal RYSUMBP responsive to the decoded signals DRS1TB, DRS2TB, DREF1TB, and DREF2TB from the decoders corresponding to the fuse box 210a.

According to the above mentioned process, the block sense amplifier circuits BSA1 through BSA(n-1) are deactivated whereas the block sense amplifier circuit BSAn is activated. Thus, data in the redundant memory block 160 associated with the selected redundant column and the selected sub word line by the sub word line decoder 120 selected by the signal RYSUMBP is sensed and amplified by the selected block sense amplifier circuit BSAn.

A redundancy operation of the random access memory device according to the present invention will be more fully described below with reference to FIG. 10B. Assume that a 7-bit column address is externally provided to the random access memory synchronized with the clock signal CLK and that two redundant columns are provided in the redundant memory block 160 shown in FIG. 1. Referring to FIG. 10A, after a first column address of "1111111" is provided, a second column address of "0000000" is inputted. Under these conditions, the second column address of "0000000" may be associated with a column of at least one defective memory cell in a selected memory block. A column in the selected memory block corresponding to the first column address is normally selected during a read/write cycle and a column in the selected memory block corresponding to the second column address may be replaced with a column in the redundant memory block. The address buffer 140 receives the second column address of "0000000" to output true address signals A1TB through A7TB of "1111111" and complement address signals A1CB through A7CB of "0000000", as illustrated in FIG. 10B.

For the purpose of description, assume that the fuses F1a and F2a in the redundancy enable circuit 220a are cut. Therefore, the signal line L1 connected in common to the fuse box circuits 211 through 217 corresponding to the circuit 220a is set low at power up. According to the above mentioned condition, since all of the fuses F3 in the fuse box 210a are cut, all of the input terminals of the NOR gate G1 in the respective fuse box circuits 211 through 217 are set low and the input terminals of the NOR gate G2 therein are set low and high in that order, respectively. These conditions deactivate the transmission gates G5 and G6 and activate the transmission gates G3 and G4. As a result, true address signals are outputted from the fuse box 210a as corresponding complement addresses signals, respectively, and complement address signals are outputted from the fuse box 210a as corresponding true address signals, respectively. Thus, as shown in FIG. 10A, true address signals RS1TB, RS2TB, RS3TB, RE1TB, RE2TB, RF1TB, and RF2TB from the fuse box 210a turn to a logic zero state, respectively, and complement address signals RS1CB, RS2CB, RS3CB, RE1CB, RE2CB, RF1CB, and RF2CB from the fuse box 210a turn to a logic one state, respectively.

The true address signals RS1TB, RS2TB, RS3TB, RE1TB, RE2TB, RF1TB, and RF2TB in converted to "0000000" from "1111111". This means that the signals from the fuse box 210a are converted to the same signals as obtained at the redundancy operation described with reference to FIG. 10A. Accordingly, the operation performed beyond this point are identical to that shown in FIG. 10A, and description thereof is thus omitted.

Having illustrated and described the principles of my invention in a preferred embodiment thereof, it should be readily apparent to those skilled in the art that the invention can be modified in arrangement and detail without departing from such principles. I claim all modifications coming within the spirit and scope of the accompanying claims.

What is claimed is:

1. A semiconductor memory device, comprising:
   an array having a plurality of memory blocks, a plurality of main word lines, and a redundant block having redundant bit lines corresponding to redundant memory cells, each of the memory blocks having a plurality of memory cells arranged at intersections of sub word lines and bit lines and the redundant block sharing the sub word lines of a predetermined memory block;
   a plurality of block sense amplifiers each arranged to correspond to the plurality of memory blocks, the redundant block sharing a block sense amplifier corresponding to the predetermined memory block;
   a redundancy controller for receiving column address signals indicative of a bit line in a selected column of a memory block and generating a sense amplification control signal, a row select signal, and column select signals when the selected column is defective;
   a plurality of sub word line decoders corresponding to the plurality of memory blocks, a sub word line of the redundant block being selected by a sub word line decoder corresponding to the redundant block responsive to the row select signal; and
   a redundant decoder for selecting a redundant column in the redundant block responsive to the column select signals, the block sense amplifier shared between the redundant block and the predetermined memory block being activated responsive to the sense amplification control signal to thereby sense data from the redundant block.

2. The semiconductor memory device of claim 1 wherein each of the column address signals includes a pair of true and complement column address signals.

3. The semiconductor memory device of claim 1 wherein the redundant block comprises a first redundant column and a second redundant column.

4. The semiconductor memory device of claim 3 wherein the redundancy controller comprises:
   first and second redundancy enable circuits corresponding respectively to the first and second redundant columns, the first and second redundancy enable circuits indicating whether a corresponding redundancy column is replaced;
   first and second fuse boxes coupled respectively to the first and second redundancy enable circuits, the first and second fuse boxes each including a fuse box circuit corresponding to the column address signals and a fuse element, each fuse box circuit receiving a corresponding pair of true and complement column address signals and manipulating the true and complement column address signals responsive to the fuse element;
   first decoding means for decoding the manipulated versions of the true and complement column address signals and generating first and second true decoded pulse signals and first and second complement decoded pulse signals;
   second decoding means for decoding the manipulated versions of the true and complement column address signals and generating third and fourth true decoded pulse signals and third and fourth complement decoded pulse signals;
   sense amplification control signal generating means for producing the sense amplification control signal responsive to the first, second, third, and fourth true decoded pulse signals and the first, second, third, and fourth complement decoded pulse signals; and
   row select signal generating means for producing the row select signal responsive to first, second, third, and fourth true decoded pulse signals.

5. The semiconductor memory device of claim 4 wherein the first decoding means comprises:
   a first true decoder for decoding the manipulated true column address signals associated with block select information and generating the first true decoded pulse signal;
   a first complement decoder for decoding the manipulated complement column address signals associated with block select information and generating the first complement decoded pulse signal;
   a second true decoder for decoding the manipulated true column address signals associated with column select information and generating the second true decoded pulse signal; and
   a second complement decoder for decoding the manipulated complement column address signals associated with column select information and generating the second complement decoded pulse signal.

6. The semiconductor memory device of claim 5 wherein each of the first and second true and complement decoders comprises:
   a logic circuit for manipulating corresponding input signals; and
   a dynamic inverter circuit for generating a decoded pulse signal responsive to a signal output from the logic circuit.

7. The semiconductor memory device of claim 4 wherein the second decoding means comprises:
   a first true decoder for decoding the manipulated true column address signals associated with block select information and generating the third true decoded pulse signal;
   a first complement decoder for decoding the manipulated complement column address signals associated with the block select information and generating the third complement decoded pulse signal;

a second true decoder for decoding the manipulated true column address signals associated with column select information and generating the fourth true decoded pulse signal; and a second complement decoder for decoding the manipulated true column address signals associated with column select information and generating the fourth complement decoded pulse signal.

8. The semiconductor memory device of claim 6 wherein each of the first and second true and complement decoders comprises:

a logic circuit for manipulating corresponding input signals; and a dynamic inverter circuit for generating a decoded pulse signal responsive to a signal output from the logic circuit.

9. A semiconductor memory device, comprising:

a plurality of memory blocks having a plurality of word lines and a plurality of memory cells formed at intersections of a plurality of sub word lines and bit lines;

a redundant memory block having a plurality of redundant bit lines associated with a plurality of redundant memory cells, the redundant memory block having a plurality of sub word lines in common with a predetermined memory block;

a plurality of block sense amplifiers corresponding to the plurality of memory blocks, the redundant memory block having a block sense amplifier in common with the predetermined memory block;

a redundancy controller for receiving column address signals indicative of a defective column of memory cells and generating a sense amplification control signal, a row select signal, and column select signals corresponding to the defective column;

a plurality of sub word line decoders positioned between adjacent memory blocks, the redundant memory block having a sub word line decoder in common with the predetermined memory block.

10. The semiconductor memory device of claim 9 including a column decoder for receiving the column address signals and selecting bit lines in respective memory blocks.

11. The semiconductor memory device of claim 9 wherein the redundancy controller includes:

a redundancy enable circuit including at least a first and a second fuses for identifying a redundancy column in the redundant memory block;

a fuse box circuit connected to the redundancy enable circuit, the fuse box circuit including a third fuse and receiving a corresponding pair of true and complement column address signals;

a first true decoder connected to the fuse box circuit for generating a first true decoded pulse signal responsive to column address signals output from the fuse box circuit;

a first complement decoder connected to the fuse box circuit for generating a first complement decoded pulse signal responsive to column address signals output from the fuse box circuit;

a second true decoder connected to the fuse box circuit for generating a second true decoded pulse signal responsive to column address signals output from the fuse box circuit;

a second complement decoder connected to the fuse box circuit for generating a second complement decoded pulse signal responsive to column address signals output from the fuse box circuit;

a sense amplification and control signal generating circuit connected to the first and second true and complement decoder for generating a sense amplification control signal responsive to the first and second true and complement decoded pulse signals; and a sub word line select signal generating circuit connected to the first and second true decoders for generating a row select signal responsive to the first and second decoded pulse signals.

12. The semiconductor memory device of claim 11 wherein each of the first and second true and complement decoders comprises:

a logic circuit for manipulating corresponding input signals; and a dynamic inverter circuit for generating the corresponding decoded pulse signal responsive to a signal output from the logic circuit.

* * * * *